(12) United States Patent
Kuhn

(10) Patent No.: US 10,101,377 B2
(45) Date of Patent: Oct. 16, 2018

(54) THERMAL MONITORING OF A CONVERTER

(75) Inventor: Andreas Kuhn, Chemnitz (DE)

(73) Assignee: Siemens Aktiengesellschaft, München (DE)

( * ) Notice: Subject to any disclaimer, the term of this patent is extended or adjusted under 35 U.S.C. 154(b) by 595 days.

(21) Appl. No.: 14/234,904

(22) PCT Filed: Jul. 23, 2012

(86) PCT No.: PCT/EP2012/064385
§ 371 (c)(1),
(2), (4) Date: Jan. 24, 2014

(87) PCT Pub. No.: WO2013/014120
PCT Pub. Date: Jan. 31, 2013

(65) Prior Publication Data
US 2014/0161152 A1    Jun. 12, 2014

(30) Foreign Application Priority Data
Jul. 27, 2011    (EP) .................................... 11175544

(51) Int. Cl.
*G01R 31/00*    (2006.01)
*H02H 6/00*    (2006.01)
*H02H 7/122*    (2006.01)

(52) U.S. Cl.
CPC ........... *G01R 31/006* (2013.01); *H02H 6/005* (2013.01); *H02H 7/122* (2013.01)

(58) Field of Classification Search
CPC .. G01K 7/42; G01K 7/22; G01K 3/04; G01K 2205/00
See application file for complete search history.

(56) References Cited

U.S. PATENT DOCUMENTS

| | | | | |
|---|---|---|---|---|
| 4,316,175 A * | 2/1982 | Korber | ...................... | B61K 9/04 246/169 A |
| 6,014,598 A * | 1/2000 | Duyar | .................. | G01R 31/343 701/31.9 |
| 6,888,469 B2 * | 5/2005 | Seferian | .................... | G01K 7/01 324/762.01 |

(Continued)

FOREIGN PATENT DOCUMENTS

| | | |
|---|---|---|
| EP | 1 583 197 A2 | 10/2005 |
| JP | 2002095155 A | 3/2002 |

(Continued)

*Primary Examiner* — Harshad R Patel
*Assistant Examiner* — Tran M Tran
(74) *Attorney, Agent, or Firm* — Henry M. Feiereisen LLC

(57) ABSTRACT

The thermal monitoring of a converter for an electric motor of a vehicle should be improved. Therefore, the invention relates to a method in which the temperature of the converter is measured. In addition, the output power of the converter is determined. The temperature of the converter is estimated using a thermal model of the converter having the output power as an input variable. The estimated temperature is compared with the measured temperature, and a corresponding monitoring signal is provided. Thus, a deviation of the measured temperature for the calculated temperature and thus a corresponding error in the cooling system can be detected even in the partial-load range.

8 Claims, 1 Drawing Sheet

(56) References Cited

U.S. PATENT DOCUMENTS

| | | | | |
|---|---|---|---|---|
| 6,999,329 B2* | 2/2006 | Poyhonen | H02M 7/493 | 363/55 |
| 7,019,951 B2* | 3/2006 | Plemmons | H02H 7/085 | 361/24 |
| 7,075,762 B2* | 7/2006 | Iimura et al. | H02H 7/122 | 361/18 |
| 7,176,804 B2* | 2/2007 | Norrena | H02H 7/1216 | 257/467 |
| 7,199,549 B2* | 4/2007 | Kleinau | B60L 11/14 | 318/787 |
| 7,248,009 B1* | 7/2007 | Sundquist | H02P 29/64 | 318/432 |
| 7,452,125 B2* | 11/2008 | Volf | G01J 5/0003 | 374/1 |
| 7,522,434 B2* | 4/2009 | Nahar | G01K 7/425 | 363/65 |
| 7,652,585 B2* | 1/2010 | Schierling | H02H 5/042 | 324/691 |
| 7,652,587 B2* | 1/2010 | Hohn | F16C 19/525 | 318/139 |
| 7,755,313 B2* | 7/2010 | Son | B60L 3/06 | 318/432 |
| 7,756,669 B2* | 7/2010 | Stancu | G06F 17/5036 | 324/431 |
| 7,789,794 B2* | 9/2010 | Hong | B60K 1/00 | 180/65.285 |
| 7,952,311 B2* | 5/2011 | Hohn | B60L 9/00 | 318/400.02 |
| 8,165,739 B2* | 4/2012 | Matsumoto | B60K 6/28 | 180/65.29 |
| 8,303,171 B2* | 11/2012 | Matsumoto | H02M 1/32 | 374/173 |
| 8,380,377 B2* | 2/2013 | Lim | B60K 6/48 | 701/22 |
| 8,482,237 B2* | 7/2013 | Berry | B60L 3/0061 | 236/67 |
| 8,547,045 B2* | 10/2013 | Wu | H02P 7/285 | 318/400.02 |
| 8,684,596 B2* | 4/2014 | Nishi | G01K 7/42 | 374/141 |
| 8,690,422 B2* | 4/2014 | Kim | G01K 7/25 | 374/144 |
| 8,703,311 B2* | 4/2014 | Sawaguchi | H01M 10/48 | 361/695 |
| 8,909,398 B2* | 12/2014 | Sawada | B60K 11/02 | 165/200 |
| 8,952,642 B2* | 2/2015 | Ayano | H02M 1/32 | 318/445 |
| 8,967,857 B2* | 3/2015 | Senoo | G01K 13/00 | 322/51 |
| 8,975,851 B2* | 3/2015 | Usami | G01K 7/42 | 318/470 |
| 9,225,283 B2* | 12/2015 | Morita | H02P 27/08 | |
| 9,313,933 B2* | 4/2016 | Sugahara | H01L 23/34 | |
| 9,725,008 B2* | 8/2017 | Wu | B60L 11/187 | |
| 2004/0008457 A1 | 1/2004 | Iimura | | |
| 2005/0257546 A1* | 11/2005 | Ishishita | B60L 3/0023 | 62/236 |
| 2005/0270707 A1 | 12/2005 | Blakely | | |
| 2014/0027089 A1* | 1/2014 | Hisada | B60L 3/003 | 165/11.1 |

FOREIGN PATENT DOCUMENTS

| | | |
|---|---|---|
| JP | 2010268614 A | 11/2010 |
| WO | WO 2005/101431 A1 | 10/2005 |

* cited by examiner

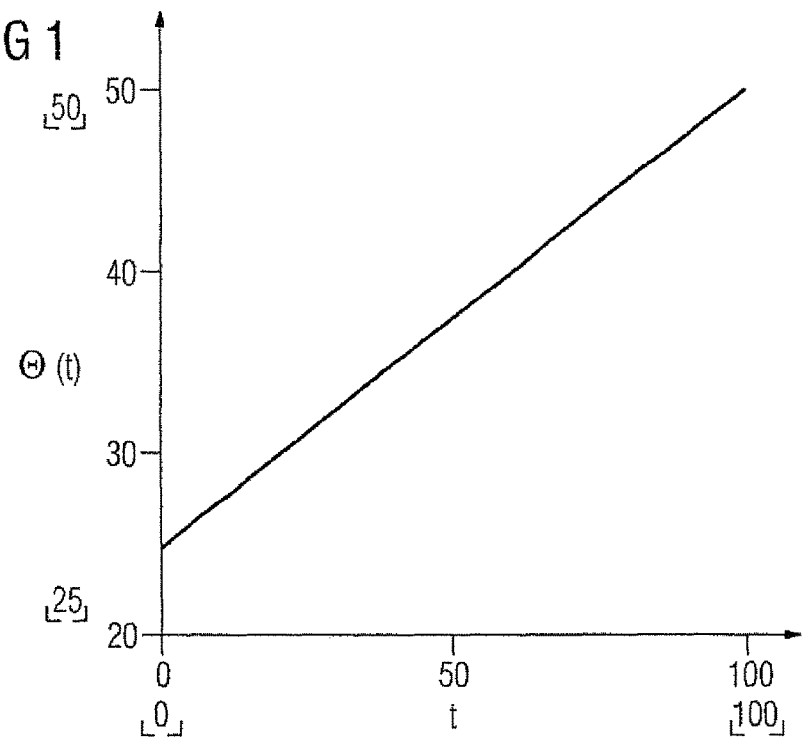
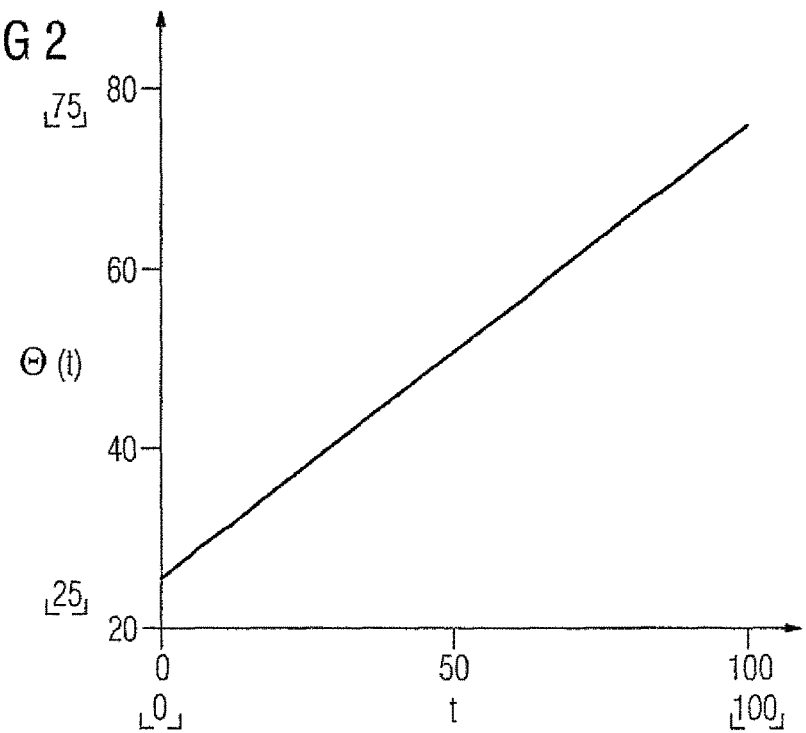

THERMAL MONITORING OF A CONVERTER

CROSS-REFERENCES TO RELATED APPLICATIONS

This application is the U.S. National Stage of International Application No. PCT/EP2012/064385, filed Jul. 23, 2012, which designated the United States and has been published as International Publication No. WO 2013/014120 and which claims the priority of European Patent Application, Serial No. 11175544.3, filed Jul. 27 2011, pursuant to 35 U.S.C. 119(a)-(d).

BACKGROUND OF THE INVENTION

The present invention relates to a method for thermal monitoring of a converter for an electric motor of a vehicle, wherein the temperature of the converter is measured. The present invention furthermore relates to a monitoring device for thermal monitoring of the converter, having a measuring facility for measuring the temperature of the converter.

Internal combustion engines in motor vehicles are usually cooled by a liquid cooling system. If this cooling system fails, then the temperature of the combustion engine rises as a function of the load figure and ambient conditions. This rise can be observed by means of a corresponding display element in the field of vision of the driver. When a critical threshold is exceeded an additional acoustic and/or visual signal is for the most part also generated which makes the driver aware of this status. The so-called time constant (time in which a certain temperature difference is overcome) for the temperature rise lies in the range of several minutes and enables the vehicle driver to still safely stop the vehicle after the malfunction is detected.

In the case of converters for the electric drive of motor vehicles a liquid cooling system having a similar structure is likewise frequently used. Since the mass of a converter is however considerably less than that of a combustion motor, the thermal time constants here lie only in the range of several tens of seconds, in other words the period of time between the detection of an excessive temperature rise and the possible destruction of the converter as a result of excess temperature is relatively short.

In conventional industrial applications a warning is issued after the excess temperature is detected. In the event of a further temperature rise a shutdown occurs in order to protect the converter. When the cooling is functioning normally this can be done without any problem. However, if the cooling fails as a result of a leak in the system, then the temperature rises so quickly under load on account of the small thermal time constants that there are only a few seconds between temperature warning and shutdown. In certain cases this is possibly insufficient in order to bring the vehicle safely to a standstill. For example, during a journey on a highway the converter is operating only under a moderate load. In other words, even in the event of failure of the cooling system the temperature of the converter certainly does not reach the warning threshold. During an overtaking maneuver, however, the load is increased from that state up to maximum power. If the cooling system has failed, the temperature rises very rapidly above the threshold for warning and shutdown, which means that the available power may be reduced or fall away completely midway through an overtaking maneuver. This can result in critical driving situations.

A method and an apparatus for detecting a contamination level of an operational converter device are known from the publication DE 10 2004 018 578 A1. The apparatus comprises a temperature model, a temperature sensor and an evaluation circuit. The temperature sensor is positioned on the component of the converter device whose temperature is to be measured. The temperature model in question is an already known temperature model for a cooling element. This temperature model is used to determine an expected cooling element temperature, depending on an actual power loss and an actual coolant temperature. If the cooling element of the converter device is contaminated, a measured cooling temperature is higher than the estimated cooling element temperature of the temperature model. A negative value is obtained as a comparison value. This signals that the cooling element of the power section of the converter device is operating worse than intended.

The object of the present invention thus consists in being able to better monitor a converter for an electric motor of a vehicle.

SUMMARY OF THE INVENTION

According to the invention this object is achieved by a method for thermal monitoring of a converter for an electric motor of a vehicle by measuring a temperature of the converter, determining a power output by the converter, providing a thermal model of the converter having the output power as an input variable, estimating the temperature of the converter by means of the thermal model with the help of the determined output power, comparing the estimated temperature with the measured temperature, and providing a monitoring signal on the basis of the comparison.

Additionally provided according to the invention are a monitoring device for thermal monitoring of a converter for an electric motor of a vehicle, having a measuring facility for measuring a temperature of the converter, and also comprising an evaluation facility for determining a power output by the converter, a computing facility in which a thermal model of the converter having the output power as an input variable is provided and by means of which the temperature of the converter can be estimated using the thermal model on the basis of the determined output power, a comparison facility for comparing the estimated temperature with the measured temperature, and a signal output facility for providing a monitoring signal based on the comparison.

In an advantageous manner the power output by the converter, in other words an electrical power, is therefore determined. The temperature exhibited by the converter can be estimated therefrom with the aid of a thermal model. The temperature of the converter is measured in parallel therewith. In an advantageous manner the temperature of the converter can thus also be monitored and made plausible in a lower value range well before a warning threshold is reached. This means that a warning can then already be issued to the driver if the temperature of the converter rises unexpectedly high at relatively low output power.

Firstly, a power loss is preferably calculated from the output power in the thermal model. The power loss can be calculated in a conventional manner from the overall electric power if the efficiency of the converter is known. The power loss is then that power which is responsible for the heating of the converter.

In the thermal model the power loss can be averaged and normalized over a preset calculation time period, and the normalized power loss can then occur in the thermal model as a factor for the estimation of the temperature. With this simple model, the estimated temperature of the converter rises linearly with the power loss.

In addition, the thermal model can be a linear function over time. This too constitutes a simplification which offers clear calculation advantages.

A time constant for the thermal model can be determined experimentally. The estimated temperature can then be proportional to a quotient of the measured time and the experimentally determined time constant. A plurality of attempts by way of which a predetermined temperature rise is averaged temporally can be included in the experimental determination of the time constant.

In particular, a cooling capacity with which the converter is cooled can be taken into consideration in the thermal model. It is thus possible for example to take into consideration for the estimation of the converter temperature whether, and where applicable how effectively, the converter is cooled by additional measures (for example liquid cooling system).

Furthermore, a start temperature of the converter which is measured when the vehicle is started up or as a starting point for an estimate can form the basis in the thermal model. Ambient conditions of the vehicle are thus also taken into consideration for estimating the converter temperature.

It is advantageous in this case if the measured start temperature occurs as a factor in the thermal model. A relatively simple thermal model thereby results.

Furthermore, on the basis of the monitoring signal a warning signal can be generated if the difference between estimated and measured temperature exceeds a preset level. Such a warning signal informs the driver that the cooling of the converter is not taking place as expected.

BRIEF DESCRIPTION OF THE DRAWING

The present invention will now be described in detail with reference to the attached drawings. in the drawings:

FIG. 1 shows a temperature model having a first time constant and

FIG. 2 shows a temperature model having a second time constant which is halved compared with the first time constant.

DETAILED DESCRIPTION OF PREFERRED EMBODIMENTS

The thermal time constant, in other words that time in which the converter heats up by a predetermined temperature value, differs significantly with and without a functioning water cooling system. In the case of specified normal use, the time constant can be easily determined and stored in the converter or the monitoring system thereof. With the time constant, a thermal model of the converter temperature can be created.

An important factor of the thermal model is the power loss of the converter. The power loss is that power which is ultimately converted into heat in the converter. It can be determined according to the following formula:

$$P_v = (1-\eta) P_{ges}$$

where $\eta$ corresponds to the efficiency of the converter, in other words the quotient of output power and input power. $P_{ges}$ corresponds to the input power, in other words the total power flowing into the converter. Said power $P_{ges}$ can be calculated from the variables normally present for regulating the drive, such as intermediate circuit voltage and output current.

The efficiency of the converter can be determined for example experimentally during a type approval test. In this situation, a dependency of the efficiency on other variables, such as ambient temperature, can under certain circumstances also be taken into consideration.

From type approval test results regarding heating tests it is moreover possible to determine the thermal time constant of the system, in other words that time in which the temperature of the system increases by a preset temperature value. Said thermal time constant is, as has already been indicated above, stored in the converter and is then available for calculation or estimation of the converter temperature to be expected in a particular operating state. The corresponding thermal model for estimating the converter temperature $\ominus$ can be as follows:

$$\ominus(t) := \left[T_0\left(1 + \frac{t}{\tau}\right)\right] * \tilde{P}_v$$

where $T_0$ is the start temperature for the estimation, $\tilde{P}_v$ is a normalized, mean power loss in the most recent calculation time period and T is the experimentally determined time constant. The start temperature $T_0$ can correspond to the temperature of the converter when the vehicle starts up, but as a rule will not do so. The start temperature $T_0$ is generally speaking rather that temperature which serves as the starting point for a calculation time period. The mean power loss $\tilde{P}_v$ is normalized in respect of a preset power or an experimentally determined power.

The thermal model presented above has deliberately been kept very simple. This means that a relatively low amount of processing power is required for estimating the temperature. In principle however, other temperature models can also be used for estimating the converter temperature. In particular, they can also be significantly more complex with regard to the calculation. For example, the thermal model can be more complex if an additional air cooling of the converter is taken into consideration.

The temperature calculated or estimated with the aid of the thermal model is compared with a measured temperature of the converter. In the event of an error the measured temperature already deviates significantly from the calculated temperature even in the partial-load range. This means that for example in the case of a vehicle which is moved with low power on the flat a considerably higher temperature is measured than is expected. Even if the measured temperature has still not reached a system-critical point the opportunity is already available to report the failure of the cooling system to the driver. The converter is then still fully functional and the vehicle is thereby also still fully maneuverable. As a result of the reconciliation or comparison between estimate and measurement a deviation of the thermal time constant is determined which is the first consequence of the failure of the liquid cooling system as a result of a leak/failure of the coolant pump. The rapid temperature rise is in turn a consequence of the change in said time constant. In other words, a cause of the rapid rise in temperature is detected which was not previously accessible. It thereby becomes possible to bring the advance warning time for the vehicle driver back to values such as are familiar to the driver from conventional internal combustion engines.

The estimation and monitoring of the temperature of the converter can be implemented with the aid of software in the converter. Since this is a matter of thermal states, the calculation can take place in low-priority time slices. It will nevertheless even then have a sufficiently accurate outcome.

FIG. 1 and FIG. 2 in each case show the temperatures plotted over time for different thermal models. The linear model described above is presupposed. The value 1 is assumed as the normalized mean power loss $\tilde{P}_v$. The progression of the estimated temperature $\Theta(t)$ illustrated in FIG. 1 then results for a time constant T=50 s and a start temperature $T_0$=25° C. The estimated temperature rises from the initial value 25° C. to the final value of 50° C. after 100 s.

If on the other hand a thermal time constant T=50 s is determined, then the linear progression shown in FIG. 2 results. According to that the estimated temperature $\Theta(t)$ rises from the initial value 25° C. to 75° C. In the case of FIG. 2 the converter therefore has a smaller thermal time constant than in FIG. 1. The reason for this may consist in the fact that the converter from FIG. 2 is cooled less effectively than the converter from FIG. 1.

If the measured temperature in each case lies significantly above that which has been estimated with the aid of the thermal model, then this can be regarded as an indication of the fact that the cooling is not operating in the desired manner. As a result of the plausibilization according to the invention of the measured converter temperature it is not necessary to monitor the cooling system directly. In particular, it is not necessary to measure the flow rate and the pressure in the cooling system, from which a failure of the coolant pump or a leak with loss of pressure could be deduced. It is frequently possible to dispense with additional sensors which would be accompanied by additional costs and an increase in complexity and susceptibility to faults of the system.

What is claimed is:

1. A method for thermal monitoring of a converter for an electric motor of a vehicle comprising:
    measuring a temperature of the converter;
    determining a power outputted by the converter;
    providing a thermal model of the converter, said thermal model having the power outputted by the converter as an input variable, and being a linear function over time;
    estimating the temperature of the converter by means of the thermal model using the determined outputted power as the input variable;
    comparing the estimated temperature with the measured temperature;
    generating a monitoring signal as a function of the comparison; and
    generating a warning signal in response to the monitoring signal, when a difference between estimated and measured temperature exceeds a preset level, thereby informing a driver that cooling of the converter is not taking place.

2. The method of claim 1, further comprising calculating with the thermal model a power loss as a function of the outputted power.

3. The method of claim 2, wherein in the thermal model the power loss is averaged and normalized over a preset calculation time period, and the normalized power loss occurs in the thermal model as a factor for the estimation of the temperature.

4. The method of claim 1, further comprising experimentally determining a time constant for the thermal model.

5. The method of claim 1, wherein a cooling capacity with which the converter is cooled is used in the thermal model as a variable.

6. The method of claim 1, wherein a start temperature of the converter which is measured when the vehicle is started up or as a starting point for an estimate forms the basis in the thermal model.

7. The method of claim 1, wherein the measured start temperature is used as a variable in the thermal model.

8. The method of claim 1, wherein the thermal model for estimating the converter temperature $\Theta$ is as follows:

$$\Theta(t) := [T_0(1+t/T)] * \tilde{P}_v$$

where $T_0$ is the start temperature for the estimation, $\tilde{P}_v$, is a normalized, mean power loss in the most recent calculation time period and T is the experimentally determined time constant.

* * * * *